(12) United States Patent
Gohara et al.

(10) Patent No.: US 9,704,779 B2
(45) Date of Patent: Jul. 11, 2017

(54) SEMICONDUCTOR MODULE COOLER AND METHOD FOR MANUFACTURING SAME

(71) Applicant: FUJI ELECTRIC CO., LTD., Kawasaki-shi (JP)

(72) Inventors: Hiromichi Gohara, Matsumoto (JP); Nobuhide Arai, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/177,885

(22) Filed: Jun. 9, 2016

(65) Prior Publication Data
US 2016/0293518 A1    Oct. 6, 2016

Related U.S. Application Data

(63) Continuation of application No. PCT/JP2015/056158, filed on Mar. 3, 2015.

(30) Foreign Application Priority Data

May 20, 2014  (JP) .................................. 2014-104118

(51) Int. Cl.
*H01L 23/34* (2006.01)
*H01L 23/473* (2006.01)
(Continued)

(52) U.S. Cl.
CPC ........ *H01L 23/473* (2013.01); *H01L 21/4871* (2013.01); *H01L 21/4882* (2013.01); *H01L 23/3672* (2013.01); *H01L 2924/0002* (2013.01)

(58) Field of Classification Search
CPC   H01L 23/473; H01L 23/3672; H01L 21/4871
(Continued)

(56) References Cited

U.S. PATENT DOCUMENTS 5,016,090 A      5/1991   Galyon et al.
7,612,448 B2 *  11/2009  Teraki ................... H01L 23/473
                                                               257/177
(Continued)

FOREIGN PATENT DOCUMENTS

JP    H04-221843 A    8/1992
JP    2007-189145 A   7/2007
(Continued)

OTHER PUBLICATIONS

PCT, "International Search Report for International Application No. PCT/JP2015/056158".

*Primary Examiner* — Nitin Parekh
(74) *Attorney, Agent, or Firm* — Manabu Kanesaka

(57) ABSTRACT

A semiconductor module cooler for reducing a pressure loss of a coolant includes a first plate mounted with a first semiconductor module; a jacket disposed under the first plate and having a distribution portion, and first and second through-holes separated from each other to be disposed at end portions of the depression respectively; an inlet-side header disposed to cover the first through-hole from under the jacket; an outlet-side header disposed to cover the second through-hole from under the jacket and extending in parallel to the inlet-side header; and a plurality of cooling fins disposed in the depression and extending from above a distribution portion of the inlet-side header to above a water collection portion of the outlet-side header.

9 Claims, 10 Drawing Sheets

(51) Int. Cl.
*H01L 21/48* (2006.01)
*H01L 23/367* (2006.01)

(58) Field of Classification Search
USPC .................................................. 257/713, 714
See application file for complete search history.

(56) References Cited

U.S. PATENT DOCUMENTS

| | | | |
|---|---|---|---|
| 8,102,652 B2* | 1/2012 | Toh | H01L 23/4006 165/104.33 |
| 9,000,582 B2* | 4/2015 | Hiramitsu | H01L 21/52 257/140 |
| 2006/0033205 A1* | 2/2006 | Sauciuc | H01L 23/42 257/712 |
| 2008/0111151 A1* | 5/2008 | Teraki | H01L 25/072 257/177 |
| 2008/0237847 A1 | 10/2008 | Nakanishi et al. | |
| 2009/0059594 A1* | 3/2009 | Lin | F21K 9/00 362/294 |
| 2010/0320753 A1 | 12/2010 | Uneno | |
| 2011/0308059 A1* | 12/2011 | Seo | B23K 20/1265 29/428 |
| 2014/0239486 A1* | 8/2014 | Gohara | H01L 23/3735 257/714 |

FOREIGN PATENT DOCUMENTS

| | | |
|---|---|---|
| JP | 2008-251932 A | 10/2008 |
| JP | 2009-195912 A | 9/2009 |
| JP | 2009-206191 A | 9/2009 |
| JP | 2012-172936 A | 9/2012 |

\* cited by examiner

Fig. 10

| | EXAMPLE 1 | EXAMPLE 2 | COMPARATIVE EXAMPLE 1 |
|---|---|---|---|
| POSITION WHERE COOLANT FLOWS FROM HEADER TO COOLING FINS | BOTTOM SURFACE | SIDE SURFACE | SIDE SURFACE |
| CROSS-SECTIONAL AREA OF COOLANT FLOW PATH SURROUNDED BY INNER WALL OF HEADER, JACKET, AND LOWER ENDS OF COOLING FINS | 67.5 | 120 | 80 |
| SMALLEST CROSS-SECTIONAL AREA OF COOLANT FLOW PATH (mm²) | 47.5 | 47.5 | 47.5 |
| THERMAL RESISTANCE (°C/W) | 0.21 | 0.22 | 0.22 |
| PRESSURE LOSS (kPa) | 12.4 | 10.8 | 25.7 |

SEMICONDUCTOR MODULE COOLER AND METHOD FOR MANUFACTURING SAME

CROSS-REFERENCE TO RELATED APPLICATION

This is a continuation application of PCT International Application No. PCT/JP2015/056158 filed on Mar. 3, 2015, which claims a priority of Japanese Patent Application No. 2014-104118 filed on May 20, 2014.

TECHNICAL FIELD

The present invention relates to a semiconductor module cooler for reducing not only the pressure loss of a coolant but also the manufacturing cost.

BACKGROUND ART

The following PTL 1 and PTL 2 have been known as literatures pertaining to semiconductor module coolers.

PTL 1 discloses a device in which a heat radiation fin and a peripheral wall are integrated to constitute a base plate with the fin, the projection amount of the heat radiation fin is equal to or smaller than that of the peripheral wall, a peripheral wall end surface of the peripheral wall is turned to the same plane, a power semiconductor module and a cooling jacket form a cooling medium flow path, and a water supply port and a water discharge port are disposed at corners of the flow path diagonal to each other.

PTL 2 discloses a method for manufacturing a casing component member to which a pipe is connected, the method having: a first step of creating a first intermediate workpiece having a connecting-part forming portion and flat portions; a second step of creating a second intermediate workpiece in which the depth of the bend of the connecting-part forming portion is greater than that of the first intermediate workpiece and the width of the flat portions is smaller; a third step of creating a third intermediate workpiece having the connecting-part forming portion, inclined flat portions, and narrow flat portions; a fourth step of creating a fourth intermediate workpiece by pressurizing the inclined flat portions of the third intermediate workpiece obliquely upward and collecting materials in the connecting part between the inclined flat portions and the side walls of the connecting-part forming portion; a fifth step of creating a fifth intermediate workpiece on which burrs are formed in the opening end portions of both side walls of the connecting-part forming portion, by pressurizing the side walls of the connecting-part forming portion, the inclined flat portions and the narrow width flat portions of the fourth intermediate workpiece from above and below; and a sixth step of creating the casing component member by removing the burrs.

CITATION LIST

Patent Literature

PTL 1: Japanese Patent Application Laid-open No. 2008-251932
PTL 2: Japanese Patent Application Laid-open No. 2009-195912

SUMMARY OF INVENTION

According to PTL 1, the heat radiation fin and the peripheral wall are integrated to constitute the base plate with the fin. PTL 1, therefore, has a problem in that the base plate with the fin on which a power semiconductor is placed and soldered cannot be fabricated easily, increasing the cost of manufacturing the device. In addition, because the coolant is supplied from the lower surface of the device, the header section where the coolant flows into the heat radiation fin has high pressure loss, which raises the need to increase the ejection capability of the coolant pump, leading to an increase in the costs of manufacturing and activating the coolant pump.

According to PTL 2, the pipe and the casing component member are manufactured separately and then joined to each other. Thus, joining the pipe and the casing component member to each other requires high fabrication accuracy, leading to an increase in the cost of manufacturing the cooler.

A conventional cooler has a configuration in which a pipe from one side surface of the cooler is joined to a header portion disposed in the cooler. Because the pipe needs to be connected within the range of the height of the side surface, the cross-sectional area of the pipe is partially reduced. Therefore, this cooler has a high pressure loss and a large pump load. In addition, the pipe for introducing/discharging the coolant is positioned with respect to the cooler in view of assemblability and maintainability, requiring flexibility in design. Furthermore, the size of the cooler itself needs to be reduced, in which balancing between coolability and reducing power loss is crucial.

Moreover, the pipe joint of the cooler is required to have a structure in which the pipe is covered or a hose is inserted thereto to connect the pipe, creating a section where the flow path partially has a small cross-sectional area. Such a configuration results in an increase in pressure loss in the cooler. Therefore, a large pump with large dynamic pressure is required in order to circulate the coolant.

Technical Problem

In order to solve the foregoing problems, the present invention aims to provide a semiconductor module cooler for reducing not only the pressure loss of the coolant but also the manufacturing cost.

Solution to Problem

In order to achieve the foregoing object, an embodiment of a semiconductor module cooler of the present invention has: a first plate on which a first semiconductor module is installed; a jacket that is disposed under the first plate, has a depression on the first plate side, and has a first through-hole and a second through-hole separated from each other to be disposed at end portions of the depression respectively; an inlet-side header that has a distribution portion disposed to cover the first through-hole from under the jacket, and an inlet-side pipe portion extending in a longitudinal direction of the distribution portion; an outlet-side header that has a water collection portion disposed to cover the second through-hole from under the jacket, and an outlet-side pipe portion extending in a longitudinal direction of the water collection portion, and that is disposed parallel to the inlet-side header; and a plurality of cooling fins that is disposed in the depression between the first plate and the jacket and extends from above the distribution portion of the inlet-side header to above the water collection portion of the outlet-side header.

According to this configuration, because the jacket has the depression for accommodating the cooling fins, fabrication of the first plate for the purpose of forming the depression is not necessary. Also the jacket, the inlet-side header, and the outlet-side header are formed as separate members and assembled into the cooler. Therefore, when designing the cooler in view of fluctuations in the flow rate of the coolant, the cooler can be designed without changing the designs of the first plate and the jacket but by changing the designs of the inlet-side header and the outlet-side header, standardizing the parts. Consequently, the cost of manufacturing the cooler can be reduced. Furthermore, because the inlet-side header is disposed parallel to the outlet-side header, the pressure losses in the cooling fans can be made substantially equal to one another, enabling even distribution of the coolant. Moreover, the longitudinal direction of the distribution portion of the inlet-side header is the same as the flow direction of the coolant in the inlet-side pipe portion, and the longitudinal direction of the water collection portion of the outlet-side header is the same as the flow direction of the coolant in the outlet-side pipe portion. Therefore, the pressure losses in these parts can be reduced more than when the flow direction of the coolant in each of these pipe portions is different from the longitudinal direction of the distribution portion or the longitudinal direction of the water collection portion. All the members of the cooler of the present invention may be made of metal. At least the first plate and the plurality of cooling fins may be made of metal and the inlet-side header and the outlet-side header may be made of resin.

In the semiconductor module cooler described above, the height of the depression of the jacket may be shorter than the inner diameter of the inlet-side pipe portion and the inner diameter of the outlet-side pipe portion.

According to this configuration, the inlet-side pipe portion and the outlet-side pipe portion are disposed in a bottom surface of the depression of the jacket. Therefore, unlike when the inlet-side pipe portion and the outlet-side pipe portion are disposed in side surfaces of the depression of the jacket, the height of the depression of the jacket can be made short without being affected by the size of the inner diameter of the inlet-side pipe portion and the size of the inner diameter of the outlet-side pipe portion. As a result, the height of the entire semiconductor module cooler can be reduced.

In the semiconductor module cooler described above, the distribution portion may have a semicircular bottom surface extending from the inlet-side pipe portion, and the water collection portion may have a semicircular bottom surface extending from the outlet-side pipe portion.

According to this configuration, because the coolant flow path from under the inlet-side pipe portion to under the inlet-side header has no steps and the coolant flow path from under the outlet-side header to under the outlet-side pipe portion has no steps, the pressure loss can be reduced.

In any one of the semiconductor module coolers described above, the plurality of cooling fins may have an inlet-side cutout region at an inlet-side end portion above the inlet-side header and an outlet-side cutout region at an outlet-side end portion above the outlet-side header, and the cooling fins at the inlet-side cutout region and the outlet-side cutout region may be shorter in height than those at a central portion of the jacket.

According to this configuration, the cross-sectional area of the coolant flow path in the longitudinal direction of the inlet-side header can be expanded to the inlet-side cutout region of the inlet-side end portion of the cooling fins, reducing the pressure loss in the inlet-side header section where the coolant flows immediately before flowing to the inlet-side end portion of the cooling fins. The reduction of the pressure loss is assumed to occur due to the homogenization of the amount of coolant flowing into each cooling fin by widening the cross-sectional area of a part of the coolant flow path where the coolant flows immediately before flowing into the cooling fins. Also, the cross-sectional area of the coolant flow path in the longitudinal direction of the outlet-side header can be expanded to the outlet-side cutout region of the outlet-side end portion of the cooling fins, reducing the pressure loss in the outlet-side header section where the coolant flows immediately after flowing out of the outlet-side end portion of the cooling fins. The reduction of the pressure loss is assumed to occur due to the homogenization of the pressure loss in the flow path between each cooling fin and the outlet-side header section by widening the cross-sectional area of a part of the coolant flow path where the coolant flows immediately after flowing out of the cooling fins. The cross-sectional areas mentioned here are the cross-sectional areas of the distribution portion and the water collection portion.

In any one of the semiconductor module coolers described above, the cross-sectional area of a coolant flow path surrounded by an inner wall of the inlet-side header, the jacket, and lower ends of the cooling fins may be larger than the cross-sectional area of the inside of the inlet-side pipe portion, and the cross-sectional area of a coolant flow path surrounded by an inner wall of the outlet-side header, the jacket, and the lower ends of the cooling fins may be larger than the cross-sectional area of the inside of the outlet-side pipe portion.

According to this configuration, the pressure losses in the coolant flow path of the inlet-side header and the coolant flow path of the outlet-side header can be reduced.

In any one of the semiconductor module coolers described above, the jacket has a second semiconductor module between the inlet-side header and the outlet-side header.

According to this configuration, the space between the inlet-side header and the outlet-side header can be utilized effectively, and thereby the number of places to install the second semiconductor module can be increased.

Any one of the semiconductor module coolers described above may have a second plate on which a capacitor is installed, wherein the jacket may have an opening between the inlet-side header and the outlet-side header, and the second plate may cover the opening from below.

According to this configuration, the capacitor can be installed between the inlet-side header and the outlet-side header, effectively utilizing the space therebetween. Because the second plate supporting the capacitor does not directly contact the cooling fins, this capacitor can be protected from the heat of the first semiconductor module or does not apply heat to the first semiconductor module.

In any one of the semiconductor module coolers described above, the jacket, the inlet-side header, and the outlet-side header may be made of resin.

According to this configuration, the parts with complicated structures can be gathered in the members molded from resin to simplify the structures of the other members, reducing the manufacturing cost.

An embodiment of a method for manufacturing a semiconductor module cooler according to the present invention is a method for manufacturing any one of the foregoing semiconductor module coolers, the method having: a cooling fin assembly step of accommodating the plurality of cooling fins in the depression of the jacket and disposing the first plate to cover the depression; a first plate connecting step of connecting the jacket and the first plate to each other;

and a header connecting step of connecting the inlet-side header and the outlet-side header to the jacket.

According to this configuration, because the jacket has the depression for accommodating the cooling fins, fabrication of the first plate for the purpose of forming the depression is not necessary. Also the jacket, the inlet-side header, and the outlet-side header are formed as separate members and assembled into the cooler. Therefore, when designing the cooler in view of fluctuations in the flow rate of the coolant, the cooler can be designed without changing the designs of the first plate and the jacket but by changing the designs of the inlet-side header and the outlet-side header, standardizing the parts. Consequently, the cost of manufacturing the cooler can be reduced.

For example, when the first plate, the jacket, the inlet-side header, and the outlet-side header are made of metal, it is preferred that the step of connecting the jacket and the first plate to each other and the step of connecting the inlet-side header and the outlet-side header to the jacket be performed by means of brazing, laser welding, or the like.

In the embodiment of the method for manufacturing the semiconductor module cooler, the header connecting step may be performed using an adhesive.

According to this configuration, the parts are connected using an adhesive to assemble the device. Thus, the inlet-side header and the outlet-side header can easily be changed to parts changed according to the required coolant flow rate or pipe diameters.

Advantageous Effects of Invention

The present invention can provide a semiconductor module cooler formed to reduce not only the pressure loss of the coolant but also the manufacturing cost.

BRIEF DESCRIPTION OF DRAWINGS

FIG. 10 is a chart showing the results of simulating the semiconductor module coolers.

DESCRIPTION OF EMBODIMENTS

Figure 1:
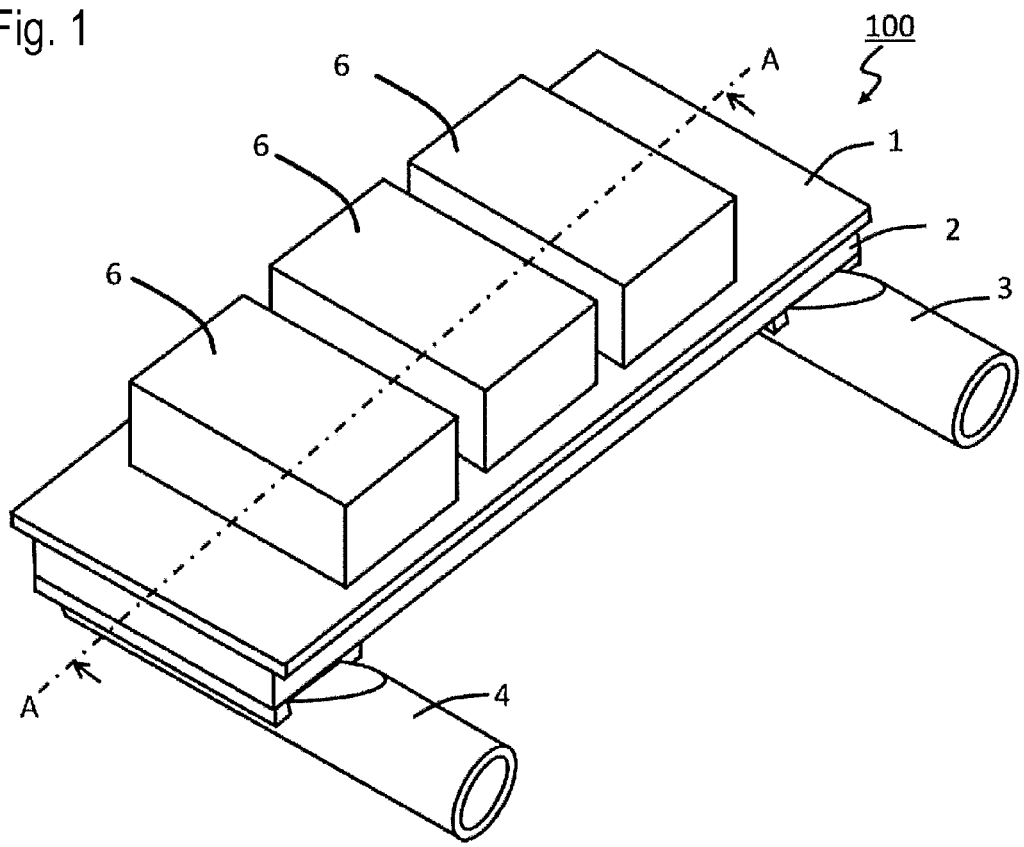
FIG. 1 is a perspective view of a semiconductor module cooler according to a first embodiment of the present invention.

Embodiments of a semiconductor module cooler according to the present invention are described hereinafter with reference to the drawings. Like reference characters are used for indicating the same components, and therefore the overlapping explanations are omitted accordingly. It should be noted that the present invention is not limited to the following embodiments, and various modifications can be made as appropriate without departing from the gist of the present invention.

First Embodiment

Figure 2:
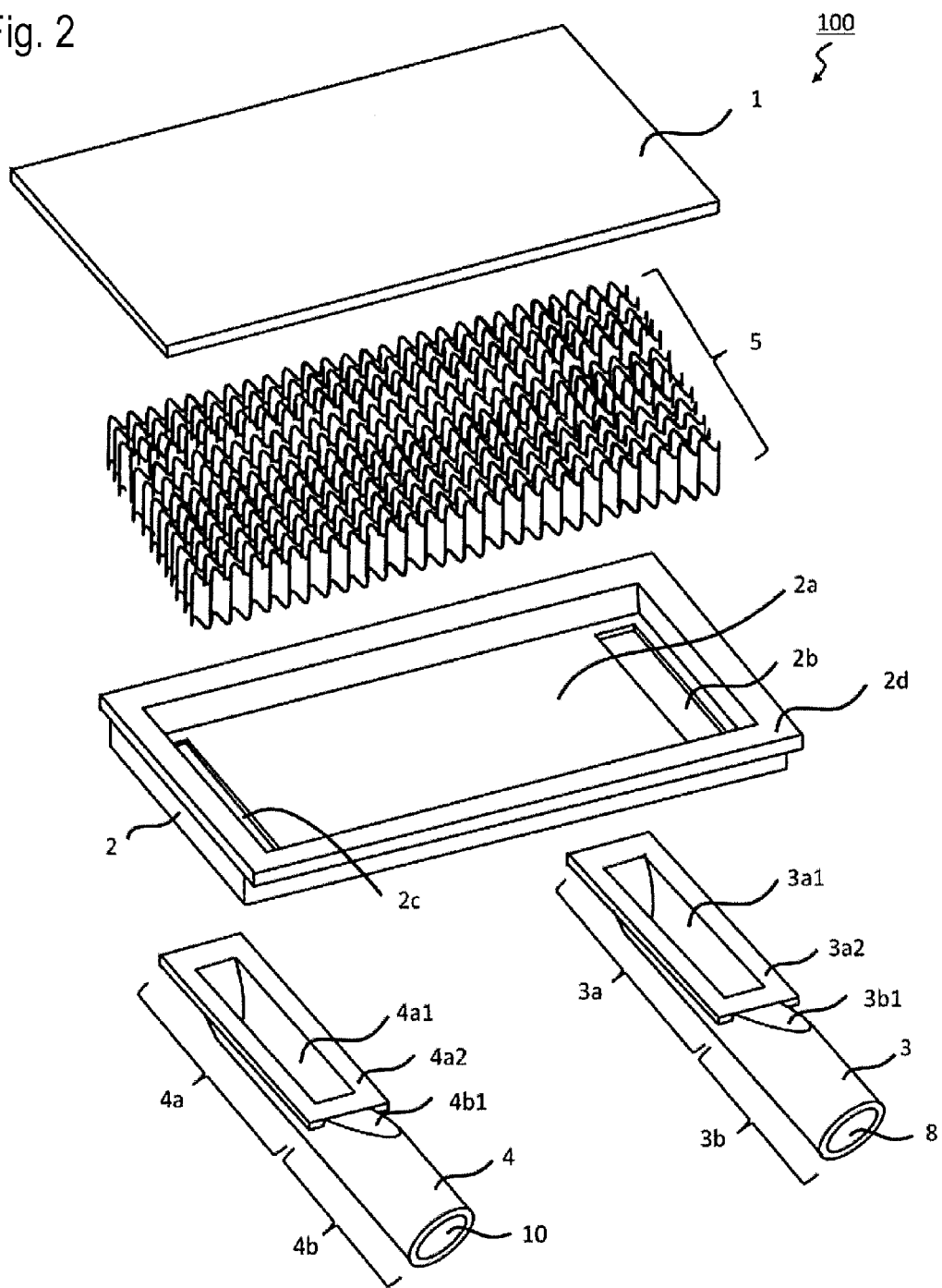
FIG. 2 is an assembly diagram of the semiconductor module cooler according to the first embodiment of the present invention.
Figure 3:
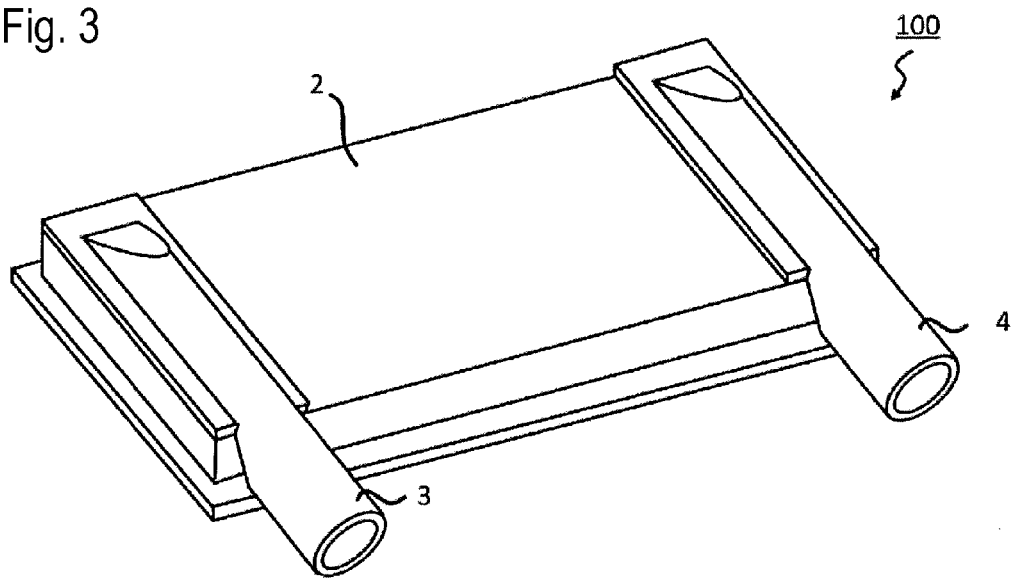
FIG. 3 is a perspective view showing the back of the semiconductor module cooler according to the first embodiment of the present invention.
Figure 4:
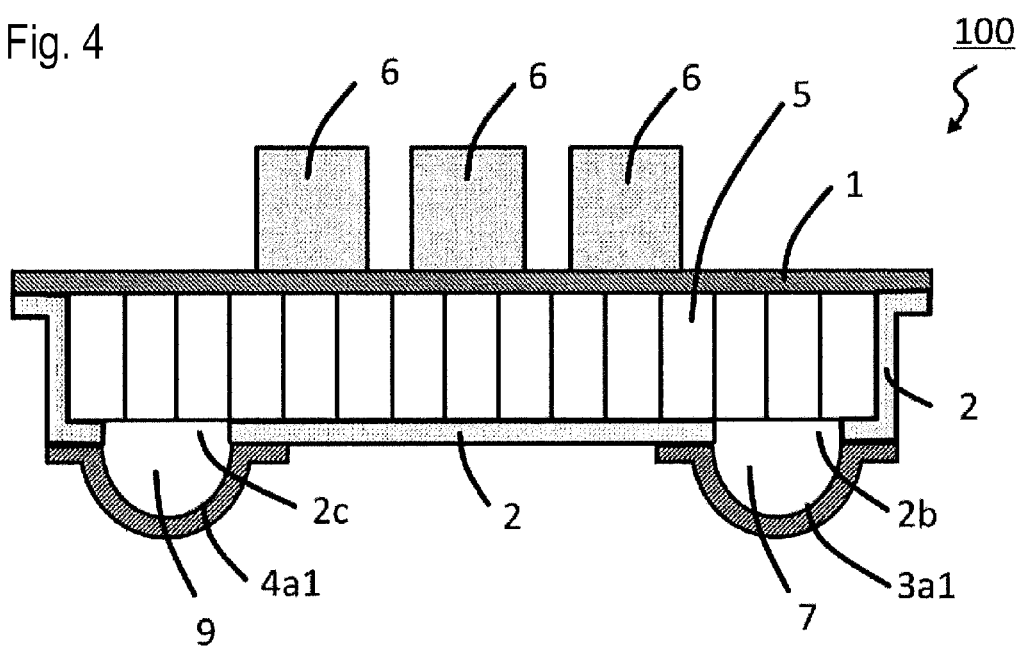
FIG. 4 is a cross-sectional diagram taken along the line A-A of FIG. 1.

A first embodiment of the present invention is now described. FIG. 1 is a perspective view of a semiconductor module cooler 100 according to the first embodiment of the present invention. FIG. 2 is an assembly diagram of the semiconductor module cooler 100 according to the first embodiment of the present invention. Note that a semiconductor module 6 is not shown in FIG. 2. FIG. 3 is a perspective view showing the back of the semiconductor module cooler 100 according to the first embodiment of the present invention. FIG. 4 is a cross-sectional diagram taken along the line A-A of FIG. 1.

As shown in FIGS. 1, 2, and 3, the semiconductor module cooler 100 according to the first embodiment of the present invention has a first plate 1 in which a first semiconductor module 6 is installed, a jacket 2 that is disposed under the first plate 1, has a depression 2a on the first plate 1 side, and has first and second through-holes 2b and 2c, separated from each other, at end portions of the depression 2a respectively, an inlet-side header 3 that has a distribution portion 3a disposed to cover the first through-hole 2b from under the jacket 2 and an inlet-side pipe portion 3b extending in a longitudinal direction of the distribution portion 3a, an outlet-side header 4, disposed parallel to the inlet-side header 3, which has a water collection portion 4a disposed to cover the second through-hole 2c from under the jacket 2 and an outlet-side pipe portion 4b extending in a longitudinal direction of the water collection portion 4a, and a plurality of cooling fins 5 that is disposed in the depression 2a between the first plate 1 and the jacket 2 and extends from above the distribution portion 3a of the inlet-side header 3 to above the water collection portion 4a of the outlet-side header 4.

The first plate 1 is connected to the first semiconductor module 6 by means of a connecting member such as solder, not shown. The back of the surface of the first plate 1, to which the first semiconductor module 6 is connected, is connected to the plurality of cooling fins 5 by means of a connecting member such as solder or a brazing filler material, not shown.

The plurality of cooling fins 5 is integrated by connecting at least part of upper or lower surfaces thereof. The height of the cooling fins 5 is 8 mm. The jacket 2 has a flange portion 2d at an upper end of the depression 2a.

Referring to FIG. 4 as well, the inlet-side header 3 has the distribution portion 3a with a semicircular bottom surface 3a1, a flange portion 3a2 formed at an upper end of the distribution portion 3a, and the inlet-side pipe portion 3b that has a tapered portion 3b1 connected smoothly to the semicircular bottom surface 3a1 and connected to the flange portion 3a2. The outlet-side header 4 has the water collection portion 4a with a semicircular bottom surface 4a1, a flange portion 4a2 formed at an upper end of the water collection portion 4a, and the outlet-side pipe portion 4b that has a tapered portion 4b1 connected smoothly to the semicircular bottom surface 4a1 and connected to the flange portion 4a2. The widths of the flow paths inside the distribution portion 3a and the water collection portion 4a are each 10 mm.

The flange portion 3a2 is provided in such a manner that the center of the inlet-side pipe portion 3b is at the height of a rear surface of the depression 2a of the jacket 2. The flange portion 4a2 is also provided in such a manner that the center of the outlet-side pipe portion 4b is at the height of the rear surface of the depression 2a of the jacket 2.

In such a structure according to the first embodiment in which the inlet-side header 3 and the outlet-side header 4 are disposed on a bottom surface of the jacket 2, not only is it possible to freely set the cross-sectional area of the header section located immediately before or after the cooling fins 5, but also the height of the fins can be set lower without being constrained by the diameter of a pipe to be connected to each header. The thickness of the depression 2a of the jacket 2 is shorter than the inner diameter of the inlet-side pipe portion 3b and the inner diameter of the outlet-side pipe portion 4b. For this reason, the tapered portion 3b1 is formed in the inlet-side pipe portion 3b and the tapered portion 4b1 is formed in the outlet-side pipe portion 4b. The part where the tapered portion 3b1 and the flange portion 3a2 are connected to each other, located before the section through which the coolant flows to the cooling fins 5, is the part where the cross-sectional area of the coolant flow path is the smallest. Similarly, the part where the tapered portion 4b1 and the flange portion 4b2 are connected to each other, located after the section through which the coolant flows out of the cooling fins 5, is the part where the cross-sectional area of the coolant flow path is the smallest.

In the first embodiment, each of the members forming the semiconductor module cooler 100 is made of aluminum. However, the materials used for creating these members are not limited to aluminum; thus, the first plate 1 and the plurality of cooling fins 5 may be made of a metal of good thermal conductivity, and the jacket 2, the inlet-side header 3, and the outlet-side header 4 may be made of resin. A diluted, ethylene glycol-based LLC (long life coolant) is used as the coolant. The type of the coolant is not particularly limited and can be changed as appropriate. The coolant is introduced from the inlet-side pipe portion 3b of the inlet-side header 3 to the cooler, flows through the distribution portion 3a where the flow direction of the coolant is changed to an acute angle, and flows into the jacket 2. The coolant is then subjected to heat exchange as it flows between the plurality of cooling fins 5 in the jacket 2. Subsequently, the coolant flows through the water collection portion 4a where the flow direction of the coolant is changed to an acute angle, and is discharged from the outlet-side pipe portion 4b of the outlet-side header 4. The coolant discharged from the cooler 100 is cooled by a radiator, not shown, and circulated to the inlet-side pipe portion 3b of the cooler 100 through a pump, not shown.

Because the water passing resistance is proportional to the square of the flow velocity of the coolant, the pump load increases when the pressure loss in the cooler 100 is high. Therefore, the cooler needs to be designed in view of the entire cooling system in addition to the thermal resistance and heat exchanging performance thereof. As shown in FIG. 10, described hereinafter, the thermal resistance and pressure loss in a semiconductor module cooler with a different flow path structure are simulated.

Second Embodiment

Figure 5:
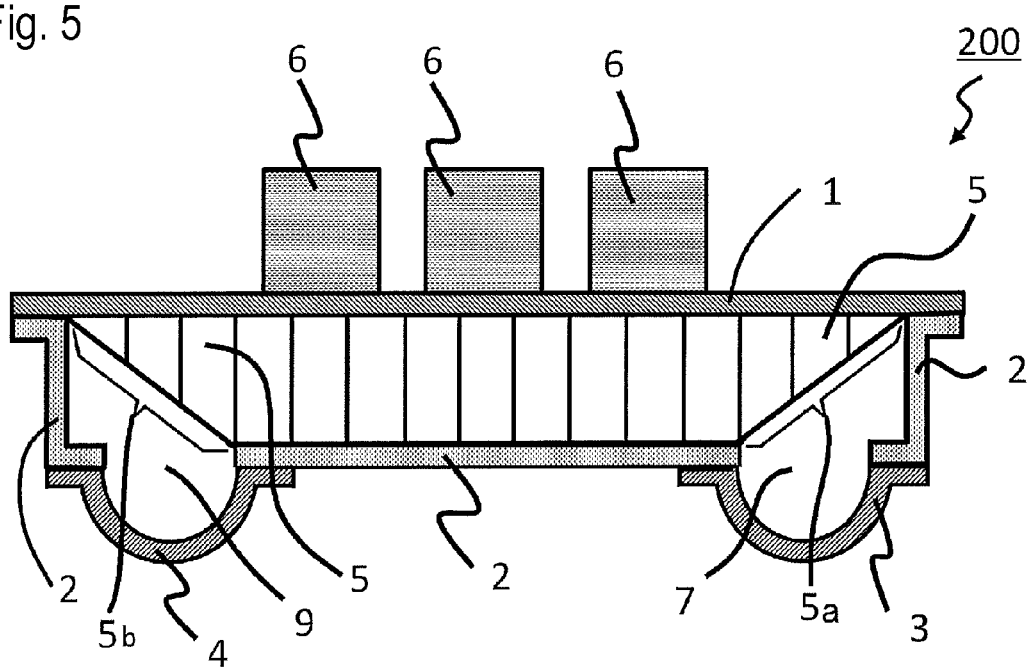
FIG. 5 is a cross-sectional diagram of a semiconductor module cooler according to a second embodiment of the present invention.

FIG. 5 is a cross-sectional diagram of a semiconductor module cooler 200 according to a second embodiment of the present invention. This cross-sectional diagram is taken along the same line as line A-A of FIG. 1. Unlike the semiconductor module cooler 100 of the first embodiment, the semiconductor module cooler 200 keeps the same shape and size but is formed to have an enlarged cross section by cutting the lower portions of the cooling fins 5 at both ends short such that these cut portions become short toward the ends. Specifically, a cross-sectional area 7 of the coolant flow path that is surrounded by an inner wall of the inlet-side header 3, the jacket 2, and the lower ends of the cooling fins 5 is larger than a cross-sectional area 8 of the inside of the inlet-side pipe portion 3b (see FIG. 2), and a cross-sectional area 9 of the coolant flow path that is surrounded by an inner wall of the outlet-side header 4, the jacket 2, and the lower ends of the cooling fins 5 is larger than a cross-sectional area 10 of the inside of the outlet-side pipe portion 4b (see FIG. 2). According to this configuration, the pressure losses in the coolant flow path of the inlet-side header and the coolant flow path of the outlet-side header can be reduced. The rest of the structure is the same as that described in the first embodiment. The plurality of cooling fins 5 has an inlet-side cutout region 5a and an outlet-side cutout region 5b. The widths of the flow paths at the distribution portion 3a and the water collection portion 4a each are 10 mm. The inlet-side cutout region 5a and the outlet-side cutout region 5b are inclined obliquely downward at the both ends of the cooling fins 5. The height of the cooling fins 5 is 8 mm.

Third Embodiment

Figure 6:
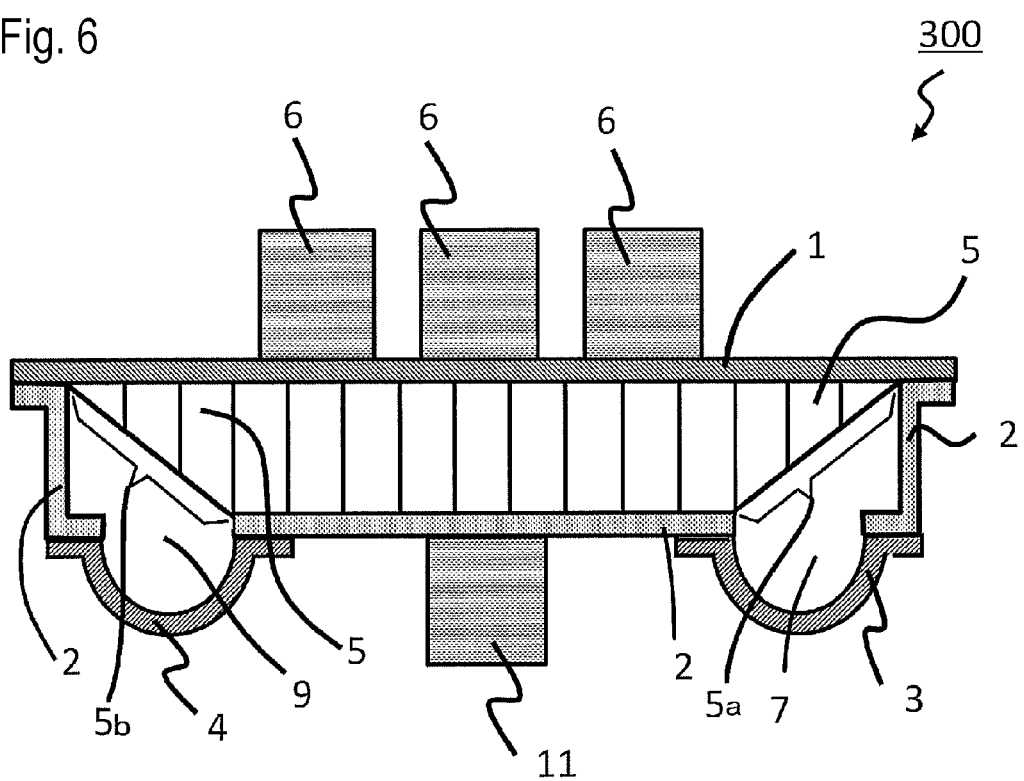
FIG. 6 is a cross-sectional diagram of a semiconductor module cooler according to a third embodiment of the present invention.

FIG. 6 is a cross-sectional diagram of a semiconductor module cooler 300 according to a third embodiment of the present invention. This cross-sectional diagram is taken along the same line as the line A-A of FIG. 1. In addition to the semiconductor module cooler 200, the semiconductor module cooler 300 has a second semiconductor module 11 between the inlet-side header 3 and the outlet-side header 4. The back of the jacket 2, to which the second semiconductor module 11 is joined, is connected to the cooling fins 5. According to this configuration, the space between the inlet-side header and the outlet-side header can be utilized effectively, and thereby the number of places to install semiconductor module can be increased.

Fourth Embodiment

Figure 7:
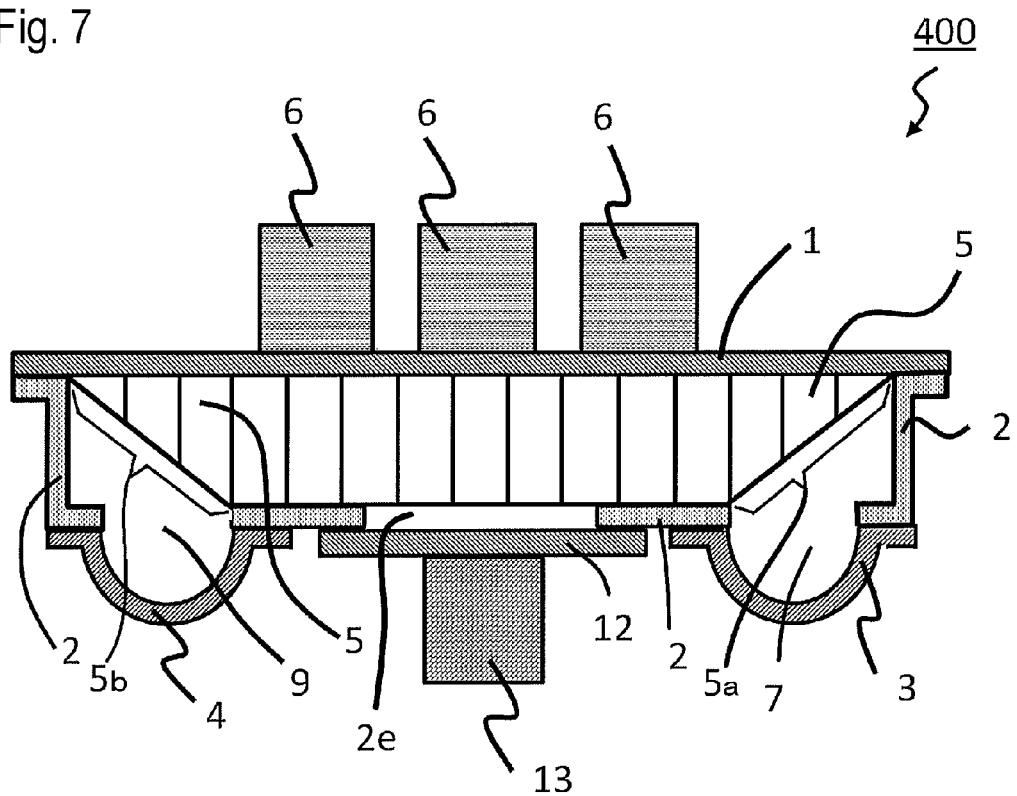
FIG. 7 is a cross-sectional diagram of a semiconductor module cooler according to a fourth embodiment of the present invention.

FIG. 7 is a cross-sectional diagram of a semiconductor module cooler 400 according to a fourth embodiment of the present invention. This cross-sectional diagram is taken along the same line as the line A-A of FIG. 1. In addition to the semiconductor module cooler 200, the semiconductor module cooler 400 has a second plate 12, a capacitor 13 disposed on a lower surface of the second plate 12, and an opening 2e formed in the jacket 2. The second plate 12 covers the opening 2e and is joined to the jacket 2 in such a manner as to not cause a water leak. The capacitor 13 and the second plate 12 are fixed to each other with a fixing member, not shown. The heat generated from the capacitor 13 is transmitted through the second plate 12 to the coolant flowing inside the semiconductor module cooler 200. The rest of the configuration is the same as the second embodiment. According to this configuration, because the second plate supporting the capacitor does not directly contact with the cooling fins, the capacitor can be protected from the heat of the first semiconductor module or does not apply heat to the first semiconductor module.

Fifth Embodiment

An embodiment of a method for manufacturing a semiconductor module cooler according to the present invention is a method for manufacturing any one of the foregoing semiconductor module coolers. The method includes: a cooling fin assembly step S1 of accommodating the plurality of cooling fins 5 in the depression 2a of the jacket 2 and disposing the first plate 1 to cover the depression 2a; a first plate connecting step S2 of connecting the jacket 2 and the first plate 1 to each other; and a header connecting step S3 of connecting the inlet-side header 3 and the outlet-side header 4 to the jacket 2.

In this method for manufacturing the semiconductor module cooler, the header connecting step S3 may be performed using an adhesive or may be performed by means of brazing or welding. When the jacket 2, the inlet-side header 3, and the outlet-side header are made of resin, an adhesive can be used to join these components together. In this case, since the resin can withstand the temperature upon connection performed in the first plate connecting step S2, the header connecting step S3 is executed after the cooling fin assembly step S1 and the first plate connecting step S2 are executed sequentially and the heat of the cooler is dissipated.

When the first plate 1, plurality of cooling fins 5, jacket 2, inlet-side header 3, and outlet-side header 4 are molded from metal, the first plate connecting step S2 and the header connecting step S3 may be executed sequentially or simultaneously after the cooling fin assembly step S1 is executed.

Comparative Example

Figure 8:
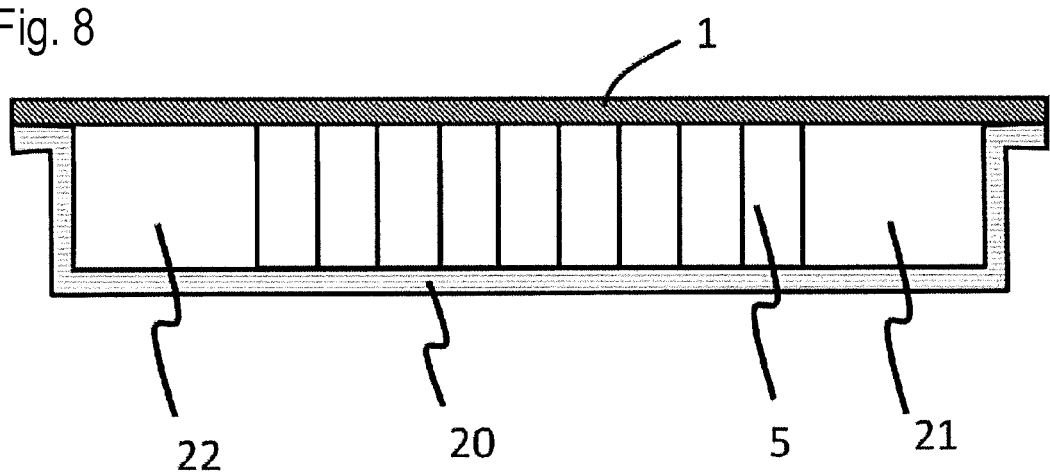
FIG. 8 is a cross-sectional diagram of a semiconductor module cooler according to a comparative example.
Figure 9:
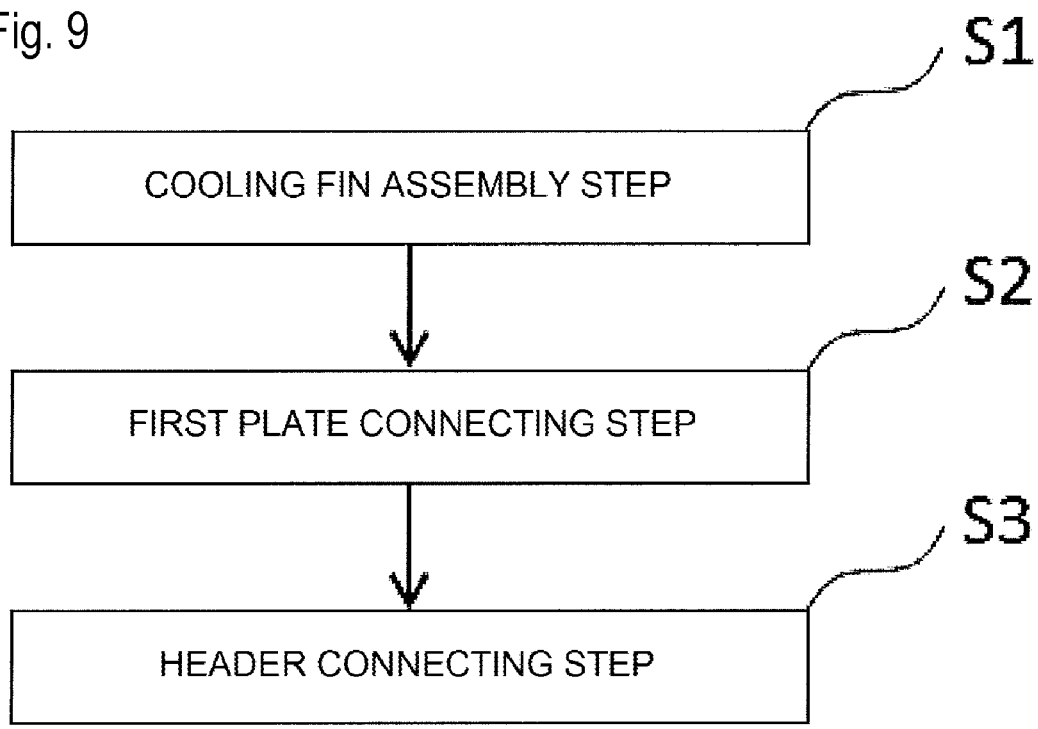
FIG. 9 is a process chart showing an embodiment of the steps of manufacturing the semiconductor module coolers according to the present invention.

FIG. 8 is a cross-sectional diagram of a semiconductor module cooler of a comparative example. The comparative example has a structure in which the inlet-side header 3 and outlet-side header 4, not shown, have the respective inlet-side pipe portion 3b and the outlet-side pipe portion 4b connected to each other by two conical tapered portions extending from the side surfaces of the depression 2a of the jacket 2. Both ends of the depression 2a of the jacket are provided with spaces, which are communicated with the tapered portions. The plurality of cooling fins 5 is disposed between these spaces. The rest of the structure is the same as the first embodiment.

The conventional cooler generally has a configuration as in the comparative example in which the header areas are located on the opposing side surfaces inside the jacket, wherein the cross-sectional area where each header area is contacting the cooling fins is determined based on the height of the cooling fins and the width for placing the fins. Such a configuration raises the need to expand the cooler in the planar direction in order to secure the flow paths in the header portions, further restricting connection of the pipes. In the comparative example, the height of the fins is calculated as 8 mm, and the width of the flow path in each header area is calculated as 10 mm. Specifically, in the comparative example, the cross-sectional area of each header is 80 mm². In the comparative example, the part where the conical tapered portions and the jacket 2 are connected to each other has the smallest flow path cross-sectional area.

FIG. 10 is a diagram showing the results of simulating the semiconductor module coolers. The thermal conductivity and pressure loss of each semiconductor module cooler were simulated by using the structures of the first embodiment, second embodiment, and Comparative Example as calculation models. A diluted, ethylene glycol-based LLC (long life coolant) was used as the coolant. The flow rate of the coolant was calculated as 10 L/min, and the coolant inflow temperature was calculated as 60° C. According to the simulation result of the first embodiment, the thermal resistance was 0.21° C./W and the pressure loss was 12.4 kPa.

According to the simulation result of the second embodiment, the thermal resistance was 0.22° C./W and the pressure loss was 10.8 kPa. Compared to the simulation result of the first embodiment, the thermal resistance was slightly higher because the cooling fins were partially cut. However, the pressure loss was reduced from 12.4 kPa (first embodiment) to 10.8 kPa. When there is a limit in the shape and size of the cooler and there is extra heat radiation capability, the structure of the second embodiment is preferred. According to the simulation result of the comparative example, the thermal resistance was 0.22° C./W and the pressure loss was 25.7 kPa.

It is clear from these simulation results that the first and second embodiments have reduced the pressure losses by 52% and 58% respectively. The first and second embodiments also show substantially the same calculation results for the thermal resistances.

According to the examples of the present invention described above, a semiconductor module cooler formed to reduce not only the pressure loss of a coolant but also the manufacturing cost, can be provided.

REFERENCE SIGNS LIST

1 First plate
2a Jacket
2a Depression
2b First through-hole
2c Second through-hole
2d Flange portion
2e Opening
3 Inlet-side header
3a Distribution portion
3a1 Semicircular bottom surface
3a2 Flange portion
3b Inlet-side pipe portion
3b1 Tapered portion
4 Outlet-side header
4a Water collection portion
4a1 Semicircular bottom surface
4a2 Flange portion
4b Outlet-side pipe portion
4b1 Tapered portion
5 Plurality of fins
5a Inlet-side cutout region
5b Outlet-side cutout region
6 First semiconductor module
7 Cross-sectional area of coolant flow path surrounded by inner wall of inlet-side header, jacket, and lower ends of cooling fins
8 Cross-sectional area of inside of inlet-side pipe portion
9 Cross-sectional area of coolant flow path surrounded by inner wall of outlet-side header, jacket, and lower ends of cooling fins
10 Cross-sectional area of inside of outlet-side pipe portion
11 Second semiconductor module
12 Second plate
13 Capacitor
100 Semiconductor module cooler
200 Semiconductor module cooler
300 Semiconductor module cooler
400 Semiconductor module cooler S1 Cooling fin assembly step
S2 First plate connecting step
S3 Header connecting step

What is claimed is:

1. A semiconductor module cooler, comprising:
    a first plate mounted with a first semiconductor module;
    a jacket disposed under the first plate, and having a depression on a first plate side, and first and second through-holes separated from each other to be disposed at end portions of the depression respectively;
    an inlet-side header having a distribution portion disposed to cover the first through-hole from under the jacket, and an inlet-side pipe portion extending from the distribution portion in a longitudinal direction of the distribution portion;
    an outlet-side header having a water collection portion disposed to cover the second through-hole from under the jacket, and an outlet-side pipe portion extending from the water collection portion in a longitudinal direction of the water collection portion and in parallel to the inlet-side header; and
    a plurality of cooling fins disposed in the depression between the first plate and the jacket, and extending from above the distribution portion of the inlet-side header toward above the water collection portion of the outlet-side header,
    wherein the plurality of cooling fins includes an inlet-side cutout region at an inlet-side end portion above the inlet-side header and an outlet-side cutout region at an outlet-side end portion above the outlet-side header, and
    a height of the inlet-side cutout region and a height of the outlet-side cutout region are less than that of the cooling fins located at a central portion of the jacket.

2. The semiconductor module cooler according to claim 1, wherein a height of the depression of the jacket is shorter than an inner diameter of the inlet-side pipe portion and an inner diameter of the outlet-side pipe portion.

3. The semiconductor module cooler according to claim 2, wherein the distribution portion has a semicircular bottom surface extending from the inlet-side pipe portion, and
    the water collection portion has a semicircular bottom surface extending from the outlet-side pipe portion.

4. The semiconductor module cooler according to claim 1, wherein a cross-sectional area of a coolant flow path surrounded by an inner wall of the inlet-side header, the jacket, and lower ends of the cooling fins is larger than a cross-sectional area of an inside of the inlet-side pipe portion, and
    a cross-sectional area of a coolant flow path surrounded by an inner wall of the outlet-side header, the jacket, and the lower ends of the cooling fins is larger than a cross-sectional area of an inside of the outlet-side pipe portion.

5. The semiconductor module cooler according to claim 1, wherein the jacket has a second semiconductor module between the inlet-side header and the outlet-side header.

6. The semiconductor module cooler according to claim 1, wherein the jacket, the inlet-side header, and the outlet-side header are made of resin.

7. A method for manufacturing the semiconductor module cooler of claim 1, comprising:
    a cooling fin assembly step of accommodating the plurality of cooling fins in the depression of the jacket and disposing the first plate to cover the depression;
    a first plate connecting step of connecting the jacket and the first plate to each other; and
    a header connecting step of connecting the inlet-side header and the outlet-side header to the jacket.

8. The method for manufacturing the semiconductor module cooler according to claim 7, wherein the header connecting step is performed using an adhesive.

9. A semiconductor module cooler, comprising:
    a first plate mounted with a first semiconductor module;
    a jacket disposed under the first plate, and having a depression on a first plate side, and first and second through-holes separated from each other to be disposed at end portions of the depression respectively;
    an inlet-side header having a distribution portion disposed to cover the first through-hole from under the jacket, and an inlet-side pipe portion extending from the distribution portion in a longitudinal direction of the distribution portion;
    an outlet-side header having a water collection portion disposed to cover the second through-hole from under the jacket, and an outlet-side pipe portion extending from the water collection portion in a longitudinal direction of the water collection portion and in parallel to the inlet-side header;
    a plurality of cooling fins disposed in the depression between the first plate and the jacket, and extending from above the distribution portion of the inlet-side header toward above the water collection portion of the outlet-side header; and
    a second plate mounted with a capacitor,
    wherein the jacket has an opening between the inlet-side header and the outlet-side header, and the second plate covers the opening from below.

* * * * *